United States Patent [19]
Hiraizumi

[11] Patent Number: 5,939,920
[45] Date of Patent: Aug. 17, 1999

[54] METHOD AND APPARATUS WHICH ADDS DISTORTION TO A SIGNAL TO COMPENSATE FOR DISTORTION ADDED AT A LATER STAGE BY A NONLINEAR ELEMENT

[75] Inventor: Maki Hiraizumi, Kawasaki, Japan

[73] Assignee: Fujitsu Limited, Kawasaki, Japan

[21] Appl. No.: 08/739,961

[22] Filed: Oct. 30, 1996

[30] Foreign Application Priority Data

Mar. 8, 1996 [JP] Japan .................................. 8-052136

[51] Int. Cl.⁶ .............................. H04B 10/00; H04N 9/69
[52] U.S. Cl. ...................... 327/306; 327/317; 327/333; 327/308
[58] Field of Search .................................. 327/306, 317, 327/333, 308, 551; 330/149

[56] References Cited

U.S. PATENT DOCUMENTS

| | | | |
|---|---|---|---|
| 5,221,908 | 6/1993 | Katz et al. | 330/149 |
| 5,225,902 | 7/1993 | McMullan | 348/12 |
| 5,523,716 | 6/1996 | Grebliunas | 330/149 |
| 5,546,048 | 8/1996 | Sano et al. | 330/263 |
| 5,562,058 | 10/1996 | Sano et al. | 327/350 |
| 5,600,472 | 2/1997 | Uesaka | 359/161 |

FOREIGN PATENT DOCUMENTS

| | | |
|---|---|---|
| 56-66909 | 6/1981 | Japan . |
| 58-147208 | 9/1983 | Japan . |
| 63-42207 | 2/1988 | Japan . |

*Primary Examiner*—Viet Q. Nguyen
*Attorney, Agent, or Firm*—Staas & Halsey

[57] ABSTRACT

An apparatus and method for providing distortion to an input signal. A first alternating current component is separated from the input signal, to provide a first signal representing the first alternating current component and a second signal representing the input signal having the first alternating current component separated therefrom. The signal level of the first and second signals is adjusted. Nonlinear distortion is provided to the signal level adjusted first signal, to produce a distorted first signal. The signal level adjusted second signal is combined with the distorted first signal, to produce a corresponding output signal.

29 Claims, 14 Drawing Sheets

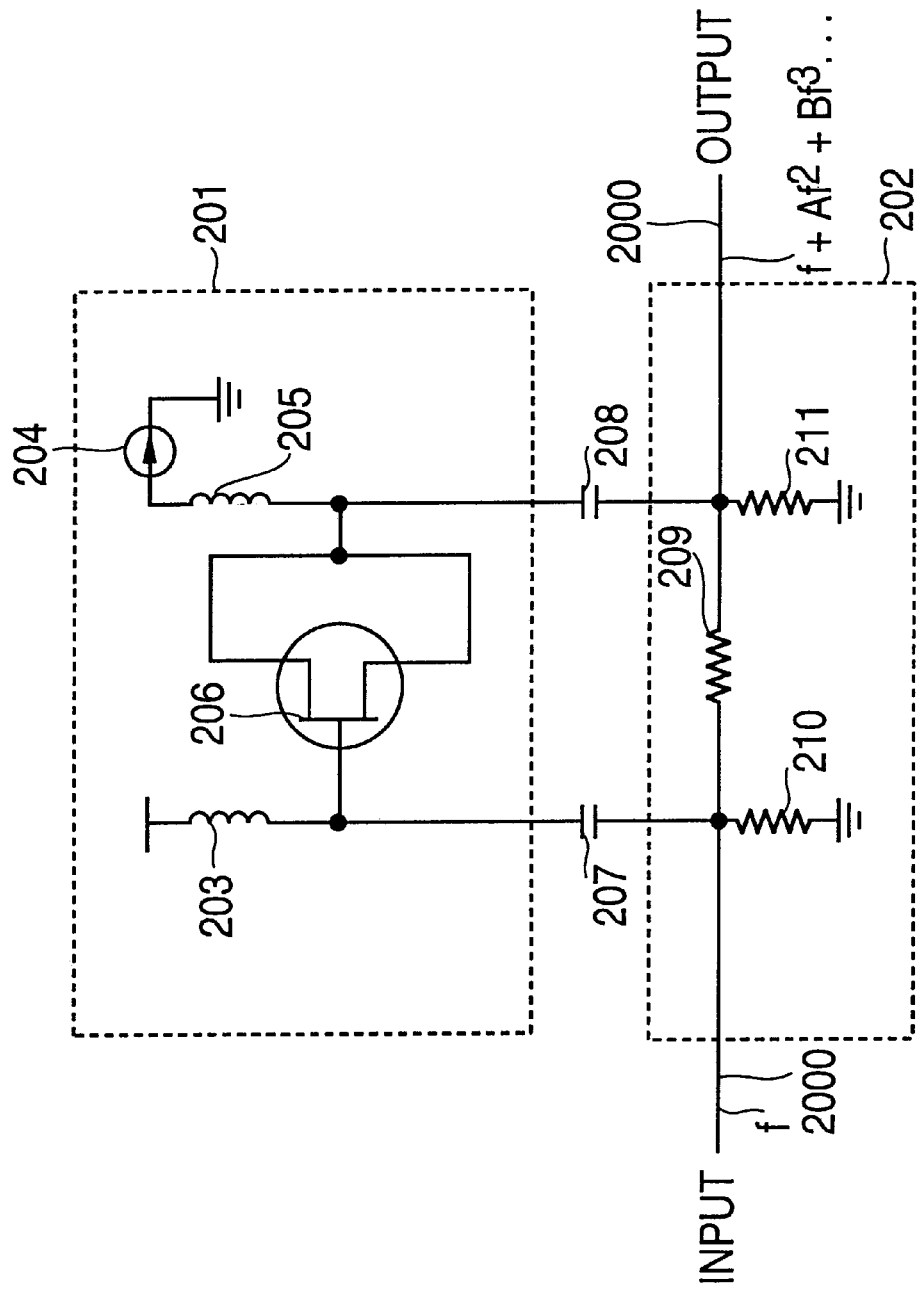

METHOD AND APPARATUS WHICH ADDS DISTORTION TO A SIGNAL TO COMPENSATE FOR DISTORTION ADDED AT A LATER STAGE BY A NONLINEAR ELEMENT

CROSS-REFERENCE TO RELATED APPLICATIONS

This application is based on, and claims priority to, Japanese patent application 08-052136, filed Mar. 8, 1996, in Japan, and which is incorporated herein by reference.

BACKGROUND OF THE INVENTION

1. Field of the Invention

The present invention relates to an apparatus and method for adding distortion to a signal, to thereby compensate for distortion affecting the signal at a later stage by a nonlinear element.

2. Description of the Related Art

Nonlinear elements, such as amplifiers and laser circuits, have nonlinear characteristics which can produce nonlinear distortion. Devices are available which compensate for such nonlinear distortion.

For example, a predistorter system can be used to compensate for nonlinear distortion. Generally, with a predistorter system, a nonlinear circuit is positioned before the nonlinear element which produces the distortion. The nonlinear circuit has opposite characteristics than those of the nonlinear element, to thereby compensate for the distortion produced by the nonlinear element.

FIGS. 1(A), 1(B), 1(C), 1(D) and 1(E) are diagrams illustrating the operation of such a conventional predistorter system. Referring now to FIG. 1(A), a nonlinear element 1202 produces nonlinear distortion. A distortion compensating unit 1201 is positioned before a nonlinear element 1202, and has nonlinear characteristics opposed to that of nonlinear element 1202. An input signal is processed by distortion compensating unit 1201 and is then provided to nonlinear element 1202. Nonlinear element 1202 then produces a distortion compensated output signal. Alternatively, distortion compensating unit 1201 can be positioned after nonlinear element 1202.

FIG. 1(B) is a graph illustrating an input signal, FIG. 1(C) is a graph illustrating the input/output characteristics of distortion compensating unit 1201, FIG. 1(D) is a graph illustrating input/output characteristics of non-linear element 1202, and FIG. 1(E) is a graph illustrating an output signal. As can be seen from FIGS. 1(C) and 1(D), the nonlinear characteristics of distortion compensating unit 1201 are opposite the nonlinear characteristics of nonlinear element 1202. As a result, as can be seen from FIGS. 1(B) and 1(E), a distortion compensated output signal is produced.

FIG. 2 is a diagram illustrating a conventional distortion compensating unit 1201. Referring now to FIG. 2, an input signal is provided to a directional coupler 1301. Direction coupler 1301 branches the input signal into a first signal and a second signal. The first signal is provided to a delay element 1302, and the second signal is provided to a distortion component generating unit 1303. Distortion component generating unit 1303 generates a distortion component for the input signal. The distortion component is then adjusted in amplitude and phase by an attenuator 1304 and a phase adjustor 1305, respectively. The adjusted distortion component is provided to a directional coupler 1306.

On the other hand, the signal received by delay element 1302 is time delayed and provided to directional coupler 1306. The delay time corresponds to the processing time of distortion component generating unit 1303, attenuator 1304, and phase adjustor 1305. Directional coupler 1306 couples the time delayed signal with the distortion component.

However, the distortion compensating unit illustrated in FIG. 2 requires a phase shifting 90° coupler and a 180° coupler for canceling a primary signal element in distortion component generating unit 1303 and phase adjustor 1305. As a result, the distortion generating unit is relatively expensive to produce and is relatively large-scale. Moreover, a 90° coupler can only be used for a limited frequency band. Therefore, the distortion compensating unit cannot be used to compensate for distortion over a broad band.

In addition, the distortion compensating unit illustrated in FIG. 2 can only be used to compensate for third order distortion since second order distortion becomes out of the band.

FIG. 3 is a diagram illustrating an additional, conventional distortion compensating unit 1201. Referring now to FIG. 3, an input signal f is received by a directional coupler 1401. Direction coupler 1401 branches the input signal into a first signal which is provided to an even-ordinal distortion generating unit 1423, and a second signal which is provided to an odd-ordinal distortion generating unit 1424.

The first signal is received by a 180° coupler 1402 of even-ordinal distortion generating unit 1423. 180° coupler 1402 branches the first signal into separate signals by shifting the phase of the first signal by 180°. The two signals output from 180° coupler 1402 are provided to diodes 1403 and 1407, respectively, and provided with distortion. A directional coupler 1411 combines the signals from diodes 1403 and 1407. Since the signals provided to diodes 1403 and 1407 are 180° shifted in phase, an odd-ordinal distortion component generated by diodes 1403 and 1407 is canceled and an even-ordinal distortion signal ($Af^2 + Bf^4 \ldots$) is output from directional coupler 1411. The $Af^2$ and $Bf^4$ correspond to the high frequencies of $A \sin 2\omega t$ and $B \sin 4\omega t$, respectively.

The second signal branched by directional coupler 1401 is received by a directional coupler 1412 of odd-ordinal distortion generating unit 1424. Directional coupler 1412 branches the second signal into two separate signals which are provided to diodes 1413 and 1417, respectively, and provided with distortion. A directional coupler 1421 combines the signals from diodes 1413 and 1417. Diodes 1413 and 1417 are set in opposite directions. As a result, an even-ordinal distortion component generated by diodes 1413 and 1417 is canceled, and an odd-ordinal distortion signal ($f + Cf^3 \ldots$) is output from directional coupler 1421.

The even-ordinal distortion signal ($Af^2 + Bf^4 \ldots$) generated by even-ordinal distortion generating unit 1423 and the odd-ordinal distortion signal ($f + Cf^3 \ldots$) generated by odd-ordinal distortion generating unit 1424 are combined by a directional coupler 1422, to thereby produce a distortion signal ($f + Af^2 + Cf^3 + Bf^4 \ldots$).

The distortion compensating unit illustrated in FIG. 3 can compensate distortion over a band of approximately DC - 500 MHz, and can adjust the odd- and even-ordinal distortions independently.

However, the distortion compensating unit illustrated in FIG. 3 is relatively costly and large-scale, since it requires the use of expensive, large scale directional couplers 1401, 1411, 1412, 1421, and 1422. Moreover, the distortion compensating unit is limited in frequency band by directional couplers 1401, 1411, 1412, 1421, and 1422. In addition, it is difficult to finely adjust distortion in such a distortion compensating unit.

SUMMARY OF THE INVENTION

Accordingly, it is an objects of the present invention to provide a distortion compensation unit which compensates for distortion over a broad band, and provides finely adjustable distortion.

It is an additional object of the present invention to provide a distortion compensation unit which has a reduced cost and complexity.

The foregoing objects of the present invention are achieved by providing an apparatus which adds preliminary distortion to an input signal. The apparatus includes first and second couplers, an adjusting unit, and a distortion generating unit. The first coupler separates a first alternating current component from the input signal, to provide a first signal representing the first alternating current component and a second signal representing the input signal having the first alternating current component separated therefrom. The adjusting unit adjusts the signal level of the first and second signals. The first distortion generating unit provides nonlinear distortion to the signal level adjusted first signal, to produce a distorted first signal. The second coupler combines the signal level adjusted second signal with the distorted first signal, to produce a corresponding output signal.

Object of the present invention are also achieved by providing an apparatus which includes a second order distortion generating unit and a third order distortion generating unit. The second order distortion generating unit generates second order distortion and provides the generated second order distortion to the input signal while suppressing third order distortion, to produce a second order distorted output signal. The third order distortion generating unit generates distortion and cancels even-ordinal components of the generated distortion to generate third order distortion, and provides the third order distortion to the second order distorted output signal, to produce an output signal having second and third order distortion.

Objects of the present invention are also achieved by providing a method which includes the steps of (1) separating a first alternating current component from an input signal, to provide a first signal representing the first alternating current component and a second signal representing the input signal having the first alternating current component separated therefrom; (2) adjusting the signal level of the first and second signals; (3) providing nonlinear distortion to the signal level adjusted first signal, to produce a distorted first signal; and (4) combining the signal level adjusted second signal with the distorted first signal, to produce a corresponding output signal.

Objects of the present invention are also achieved by providing a method which includes the steps of (1) generating second order distortion and providing the generated second order distortion to an input signal while suppressing third order distortion, to produce a second order distorted output signal; and (2) generating distortion and cancelling even-ordinal components of the generated distortion to generate third order distortion, and providing the third order distortion to the second order distorted output signal, to produce an output signal having second and third order distortion.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 5 is a diagram illustrating a distortion compensating unit, according to an embodiment of the present invention.

DESCRIPTION OF THE PREFERRED EMBODIMENTS

Figure 1A:
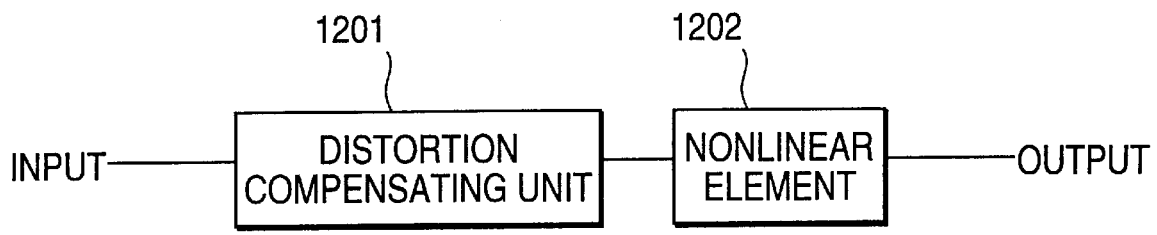
FIG. 1 (prior art) is a diagram illustrating a conventional predistorter system.
Figure 1B:
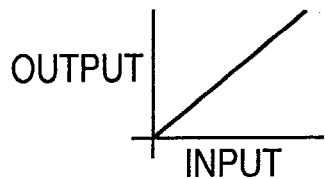
Figure 1C:
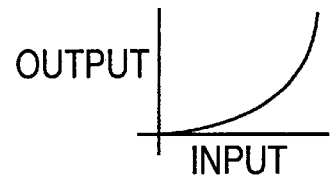
Figure 1D:
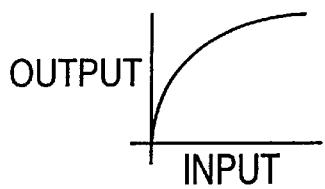
Figure 1E:
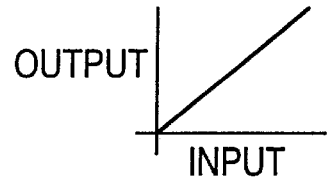
Figure 2:
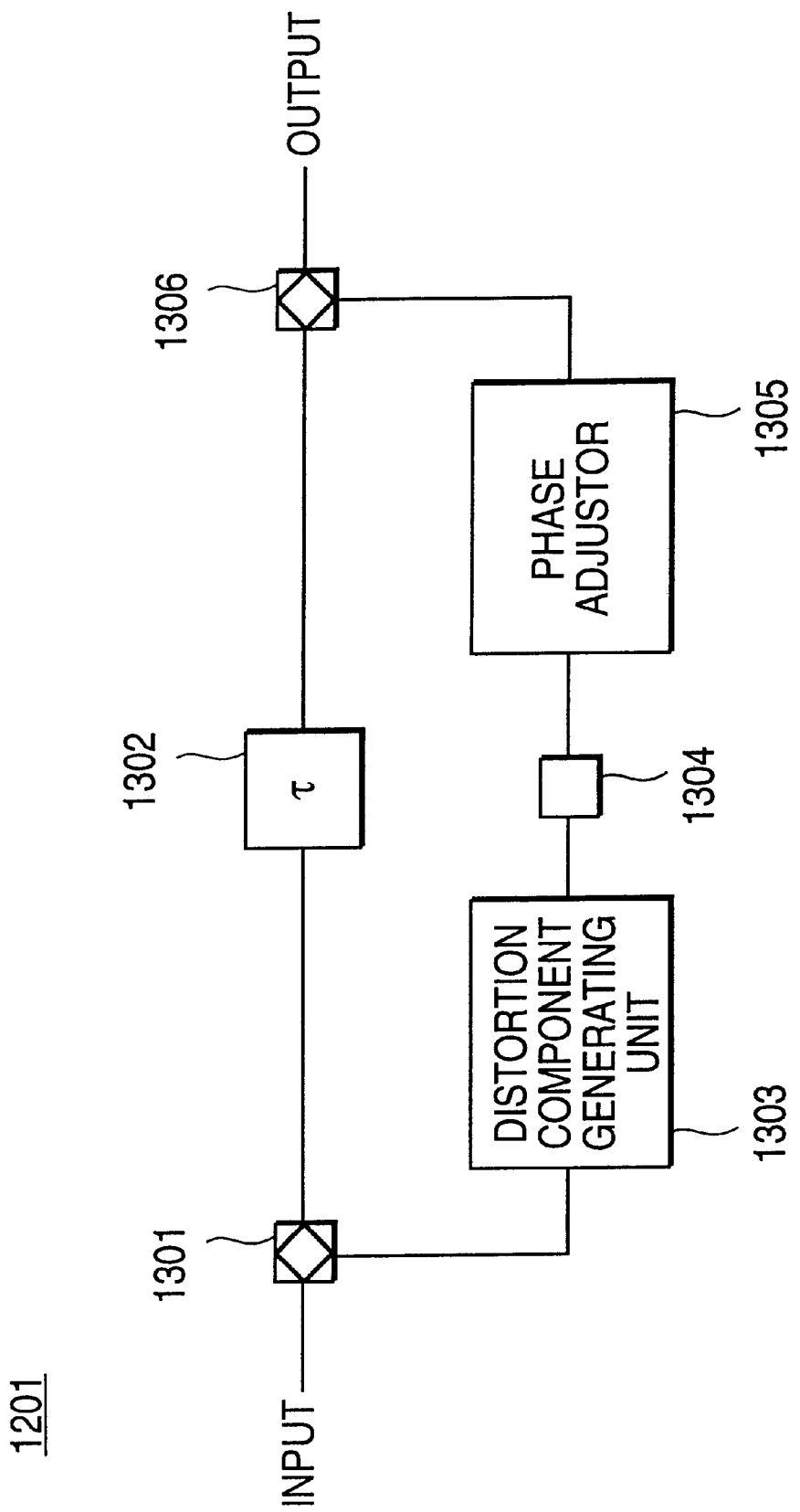
FIG. 2 (prior art) is a diagram illustrating a conventional distortion compensating unit.
Figure 3:
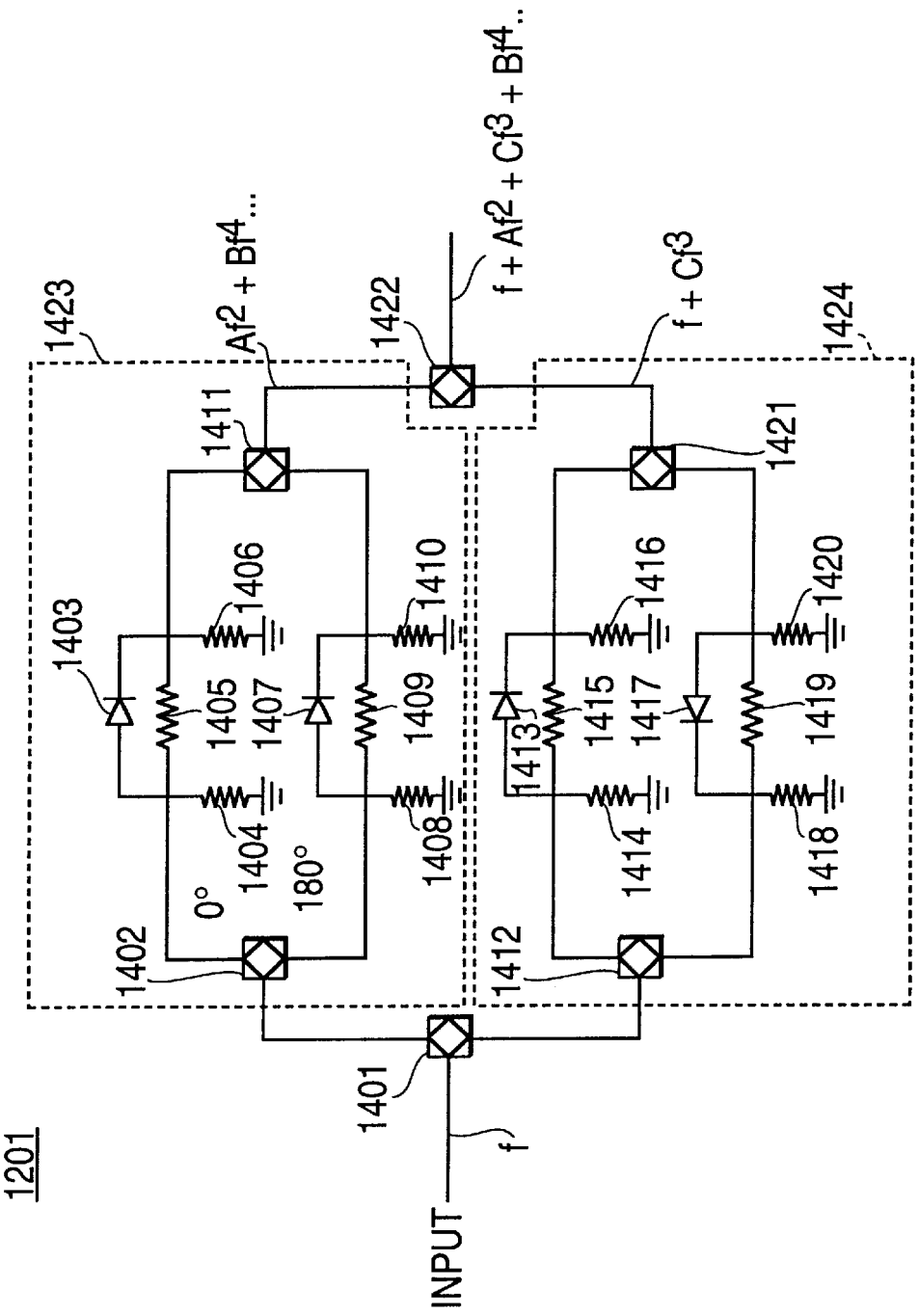
FIG. 3 (prior art) is a diagram illustrating a conventional distortion compensating unit.

Reference will now be made in detail to the present preferred embodiments of the present invention, examples of which are illustrated in the accompanying drawings, wherein like reference numerals refer to like elements throughout.

Figure 4:
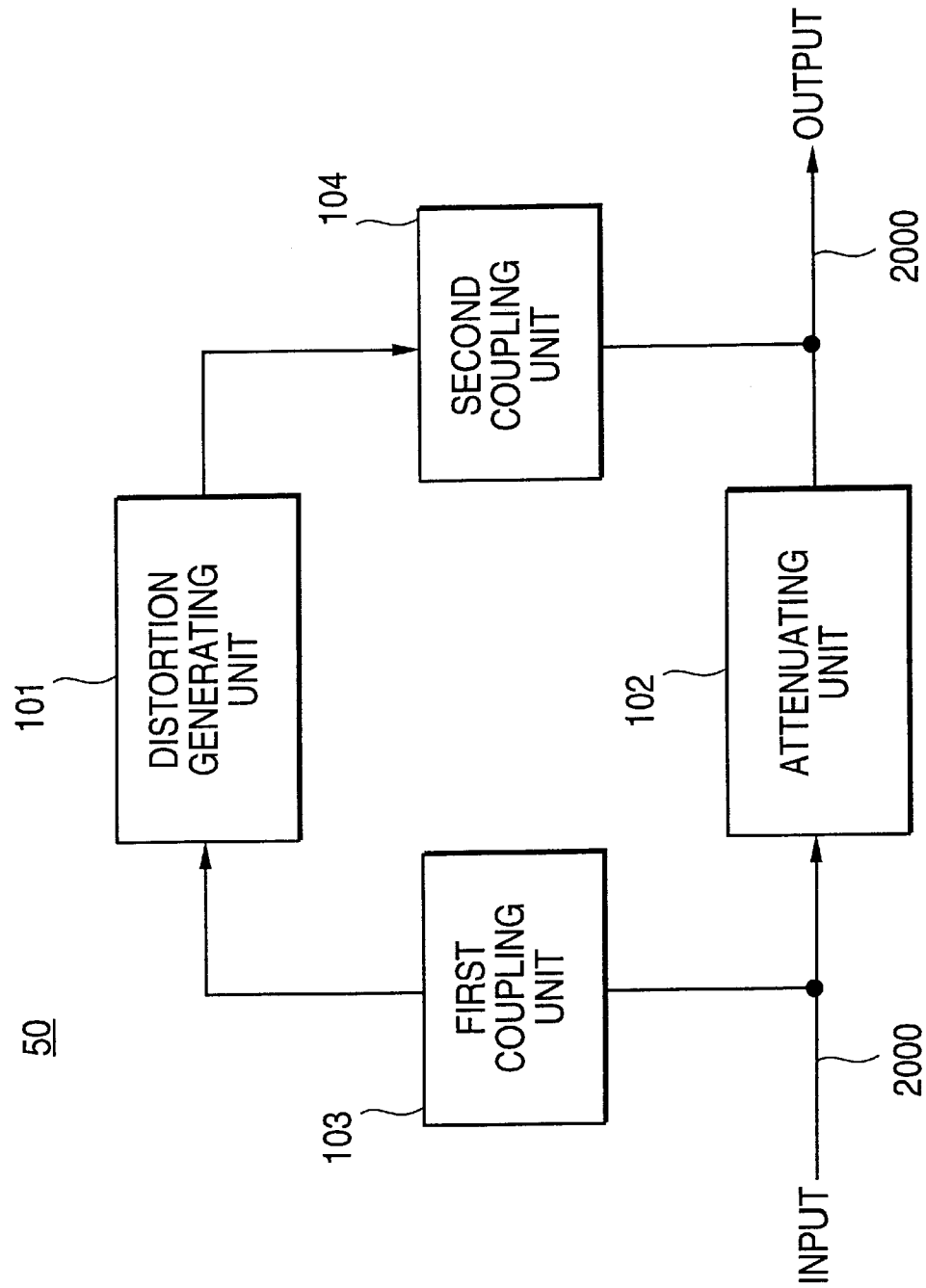
FIG. 4 is a diagram illustrating a distortion compensating unit, according to an embodiment of the present invention.

FIG. 4 is a diagram illustrating a distortion compensating unit 50, according to an embodiment of the present invention. Referring now to FIG. 4, distortion compensation unit 50 has an input and an output. A transmission line 2000 is connected to the input and the output, for providing an input signal to distortion compensating unit 50, and for receiving a distortion compensated signal at the output of distortion compensating unit 50. An attenuating unit 102 is connected between the input and the output of distortion compensating unit 50.

An input signal is provided to attenuating unit 102 via transmission line 2000. Attenuating unit 102 attenuates the input signal and produces a corresponding attenuated signal. Attenuating unit 102 includes, for example, a resistor (not illustrated) or a PIN attenuator circuit (not illustrated).

A first coupling unit 103 couples attenuating unit 102 to a distortion generating unit 101. First coupling unit 103 passes only alternating current components of an input signal to distortion generating unit 101. More specifically, first coupling unit 103 blocks direct current components from being transferred between distortion generating unit 101 and attenuating unit 102.

Distortion generating unit 101 generates distortion to be added to the input signal. Distortion generating unit comprises a nonlinear element (not illustrated), such as a diode, and generates distortion by controlling the nonlinear element. Distortion generated by distortion generating unit 101 is adjusted by changing a bias current provided to the nonlinear element. Adjusting the level of attenuation by attenuating unit 102 successfully adjusts the amount of power of the input signal provided for distortion generating unit 101, and thereby adjusts the amount of distortion provided for the input signal.

A second coupling unit 104 couples alternating current components of the distortion generated by distortion generating unit to attenuating unit 102. More specifically, second coupling unit blocks direct current components from being transferred between distortion generating unit 101 and attenuating unit 102. Thus, second coupling unit 104 combines an alternating current, distortion signal generated by distortion generating unit 101 with the output signal of attenuating unit 102. To block direct current components but allow alternating current components to pass therethrough, first and second coupling units 103 and 104 each comprise, for example, a capacitor (not illustrated).

Attenuating unit 102 maintains an impedance which is consistent with the impedance of transmission line 2000. Therefore, attenuating unit 102 allows an input signal to be transmitted over a broad band, and a part of the input signal to be provided to distortion generating unit 101 through first coupling unit 103. Further, as previously described, the transmission of direct current between distortion generating unit 101 and attenuating 23 unit 102 is interrupted by first and second coupling unit 103 and 104. As a result, a distortion operating point on a nonlinear element (not illustrated) of distortion generating unit 101 can be fixed, regardless of the operation of attenuating unit 102. Moreover, as will be discussed in more detail below, the amount of distortion provided by the nonlinear element can be adjusted by controlling a bias current of the nonlinear element.

FIG. 5 is a more detailed diagram illustrating a distortion compensating unit 55, according to an embodiment of the present invention. Referring now to FIG. 5, a distortion generating unit 201 distorts an input signal. An attenuating unit 202 adjusts the amount of power to be provided for distortion generating unit 201. Capacitors 207 and 208 prevent high frequency components from being transmitted between distortion generating unit 201 and attenuating unit 202. Thus, distortion generating unit 201, attenuating unit 202, and inductors 203 and 205 in FIG. 5 correspond, respectively, to distortion generating unit 101, attenuating unit 102 and first and second coupling units 103 and 104, respectively, in FIG. 4.

Distortion generating unit 201 includes a field-effect transistor 206 which is, for example, a GaAs field-effect transistor, a high electron mobility transistor (HEMT), or any other compound semiconductor field-effect transistor such as InP or ZnSe. Thus, field-effect transistor 206 is a nonlinear element for generating distortion. Field-effect transistor 206 is shorted between its source and drain. Distortion generating unit 201 also includes an electric current source 204 having a variable current, and inductors 203 and 205. Electric current source 204 provides a variable bias current for controlling field-effect transistor 206. Inductors 203 and 205 prevent high frequency components from being externally transmitted from distortion generating unit 201.

Attenuating unit 202 includes resistors 209, 210 and 211 for maintaining an impedance which matches the impedance of transmission line 2000. Resistors 209, 210 and 211 are connected in a π configuration. More specifically, one end of resistor 210 and one end of resistor 211 is connected to ground, and resistor 209 is connected between the other ends of resistors 210 and 211. Transmission line 2000 is connected to a connection point between resistors 209 and 210, and to a connection point between resistors 209 and 211.

Transmission line 2000, at the input of distortion compensating unit 55, is connected to the gate of field-effect transistor 206 through capacitor 207. Transmission line 2000, at the output of distortion compensating unit 55, is connected to the source and drain of field-effect transistor 206 through capacitor 208. The gate of field-effect transistor 206 is connected to electric current source 204 through ground via inductor 203. An input terminal of electric current source 204 is connected to the source and drain of field-effect transistor 206 through inductor 205. An output terminal of electric current source 204 is connected to ground.

Direct current from electric current source 204 is provided to field-effect transistor 206 through inductors 203 and 205, to set a bias point of field-effect transistor 206. Capacitors 207 and 208 prevent direct current from electric current source 204 from being transmitted to attenuating unit 202.

When an input signal f is transmitted to attenuating unit 202, high frequency components of the input signal are provided to distortion generating unit 201 through capacitor 207. Field-effect transistor 206 produces a distortion component so that distortion compensating unit 55 outputs a distortion compensated output signal ($f+Af^2+Bf^3$ ...). Since attenuating unit 202 maintains an impedance which matches the impedance of transmission line 2000, distortion can be compensated over a broad band of several kHz through 1 GHz or more.

Figure 6A:
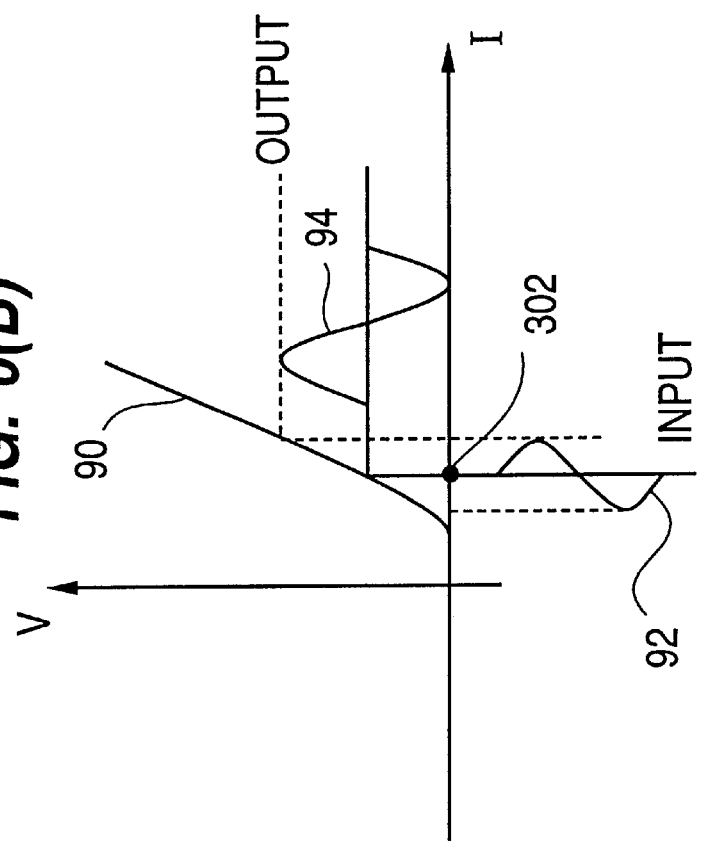
FIGS. 6(A) and 6(B) are graphs illustrating the operation of the distortion compensating unit illustrated in FIG. 5, according to an embodiment of the present invention.
Figure 6B:
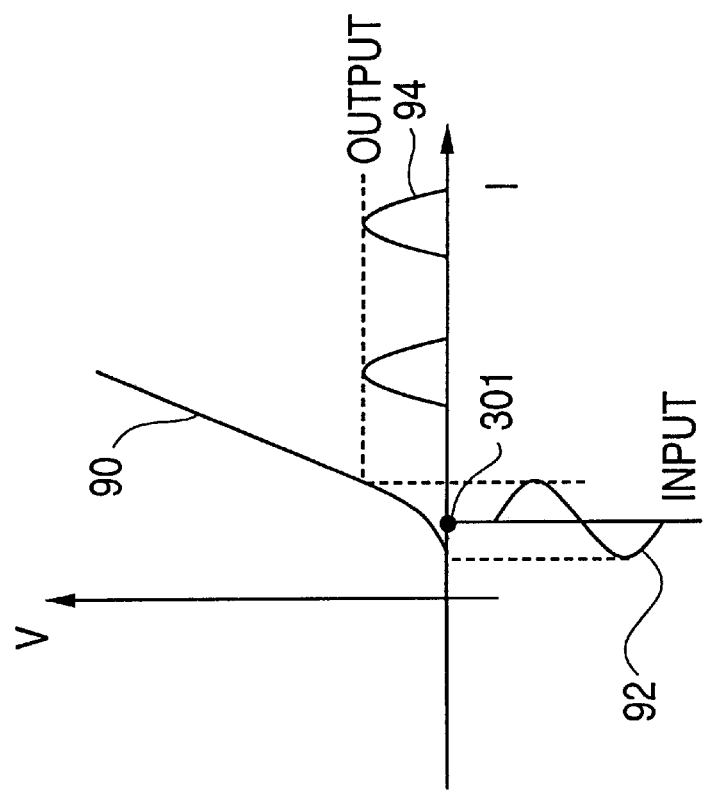

FIGS. 6(A) and 6(B) are graphs illustrating the operation of distortion compensating unit 55, according to an embodiment of the present invention, wherein the direct current supplied by electric current source 204 is adjusted.

More specifically, FIG. 6(A) is a graph illustrating the operation of the distortion compensating unit when the bias current provided to field-effect transistor 206 is small. Referring now to FIG. 6(A), curve 90 represents the voltage (V)-current (I) characteristics of field-effect transistor 206, curve 92 represents an input signal supplied to distortion compensating unit 55, and curve 94 represents an output signal produced by distortion compensating unit 55. As illustrated in FIG. 6(A), when the bias current is small, the input signal 92 oscillates around a bias point 301 in an area in which a nonlinear level is high. As a result, the distortion applied by field-effect transistor 206 is large.

FIG. 6(B) is a graph illustrating the operation of distortion compensating unit 55 when the bias current provided to field-effect transistor 206 is large. Referring now to FIG. 6(B), when the bias current is large, the input signal 92 oscillates around a bias point 302 in an area in which a nonlinear level is low. As a result, the distortion applied by field-effect transistor 206 is small.

Since distortion generating unit 201 and attenuating unit 202 are coupled together through capacitors 207 and 208, the transmission of direct current between distortion generating unit 201 and attenuating unit 202 is interrupted and the bias current of field-effect transistor 206 is constant. Therefore, the distortion applied by field-effect transistor 206 can be adjusted.

FIGS. 7(A), 7(B), 8(A) and 8(B) are graphs illustrating the control of distortion by adjusting the attenuation of attenuating unit 202, according to an embodiment of the present invention.

Figure 7B:
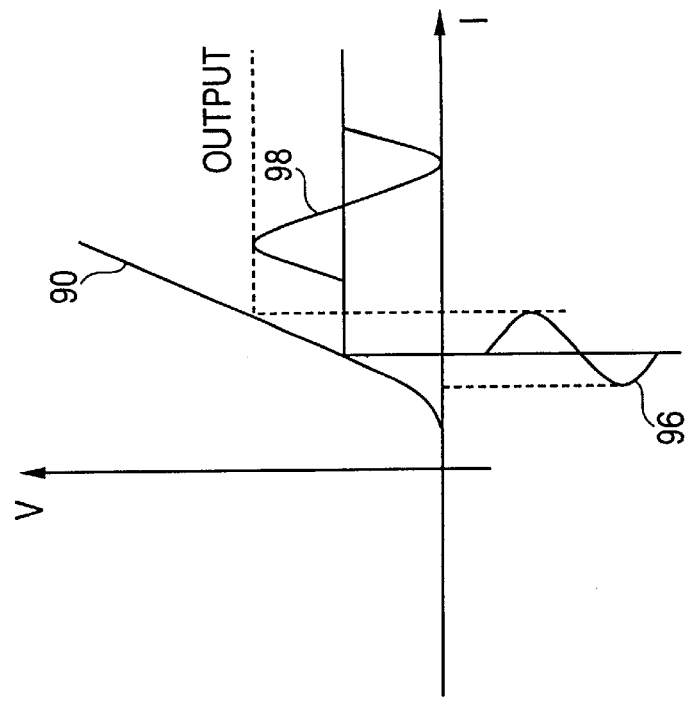
FIGS. 7(A) and 7(B) are graphs illustrating the operation of the distortion compensating unit illustrated in FIG. 5, according to an embodiment of the present invention.
Figure 7A:
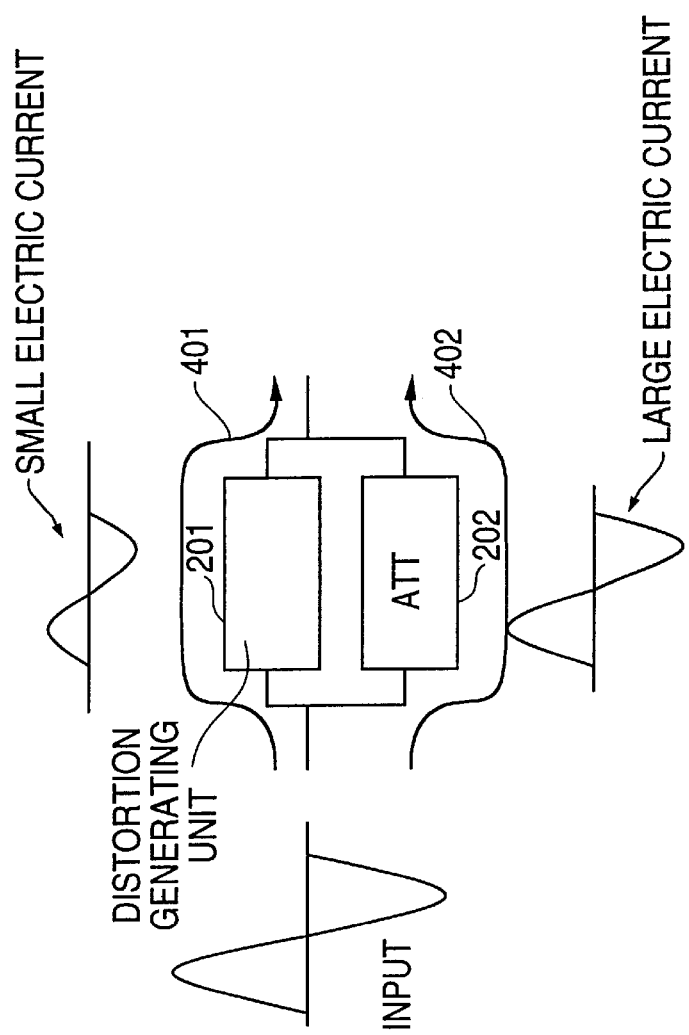

More specifically, FIGS. 7(A) and 7(B) are graphs illustrating the amount of distortion when the amount of attenuation by attenuation unit 202 is small. Referring now to FIG. 7(A), when the amount of attenuation is small, electric power 402 of the input signal provided to attenuating unit 202 increases and electric power 401 provided to distortion generating unit 201 decreases. Therefore, as illustrated in FIG. 7(B), the input level of an input signal 96 provided to distortion generating unit 201 becomes lower, and an output signal 98 of distortion generating unit 201 indicates that the amount of distortion applied by distortion generating unit 201 becomes smaller.

Figure 8B:
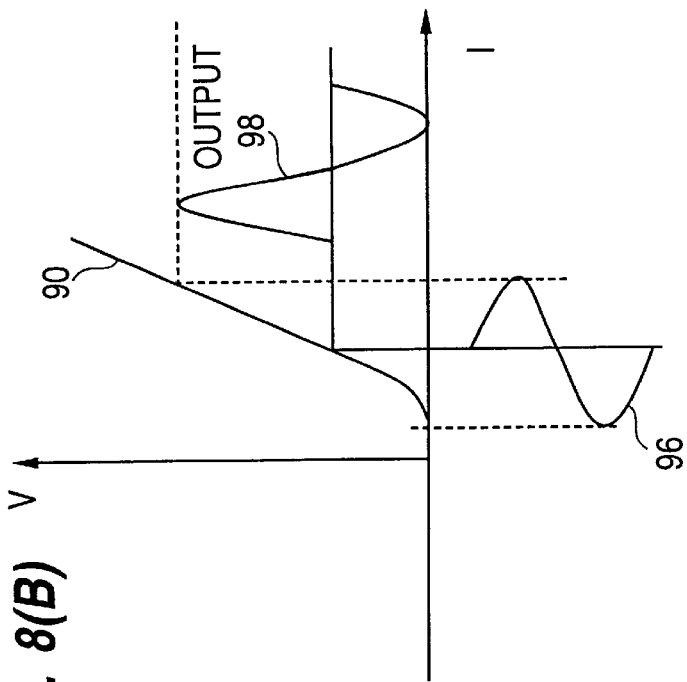
FIGS. 8(A) and 8(B) are graphs illustrating the operation of the distortion compensating unit illustrated in FIG. 5, according to an embodiment of the present invention.
Figure 8A:
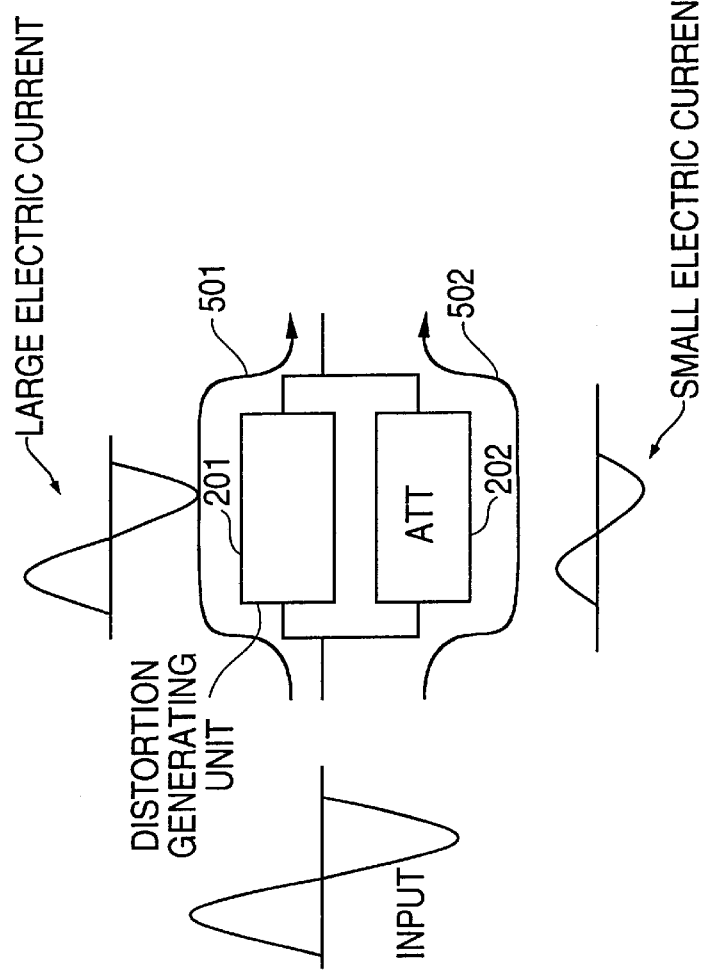

FIGS. 8(A) and 8(B) are graphs illustrating the amount of distortion when the amount of attenuation by attenuation unit 202 is large. Referring now to FIG. 8(A), when the amount of attenuation is large, an electric power 502 provided for attenuating unit 202 decreases and an electric power 501 provided for distortion generating unit 201 increases. Therefore, as illustrated in FIG. 8(B), the input level of the input signal 96 provided to distortion generating unit 201 becomes higher and the output signal 98 of distortion generating unit 201 indicates that the amount of distortion applied by distortion generating unit 201 becomes larger.

Thus, field-effect transistor 206 functions as a distortion generating element. However, instead of a field-effect transistor, some other type of nonlinear element, such as a diode, can be used as the distortion generating element.

According to the above embodiments of the present invention, the amount of distortion applied to an input signal can be adjusted for a high frequency component of the input signal. By using a GaAs field-effect transistor 206 shorted between the source and drain as a distortion generating element, a uniform distortion can be generated over a broad band of a few kHz through 1 GHz or more, and with a relatively simple circuit configuration.

When distortion is compensated in a broad band of 1 GHz or more, a diode can be used as the distortion generating element. The diode should have a band of 10 GHz or more and including an even band of 1 GHz or more. Such a diode can be a Schottky diode. However, a Schottky diode is microscopic, requires a high implementation technology, and is costly. Therefore, a GaAs field-effect transistor 206 can be used to realize a distortion compensating circuit having a simple, relatively inexpensive configuration.

Figure 9:
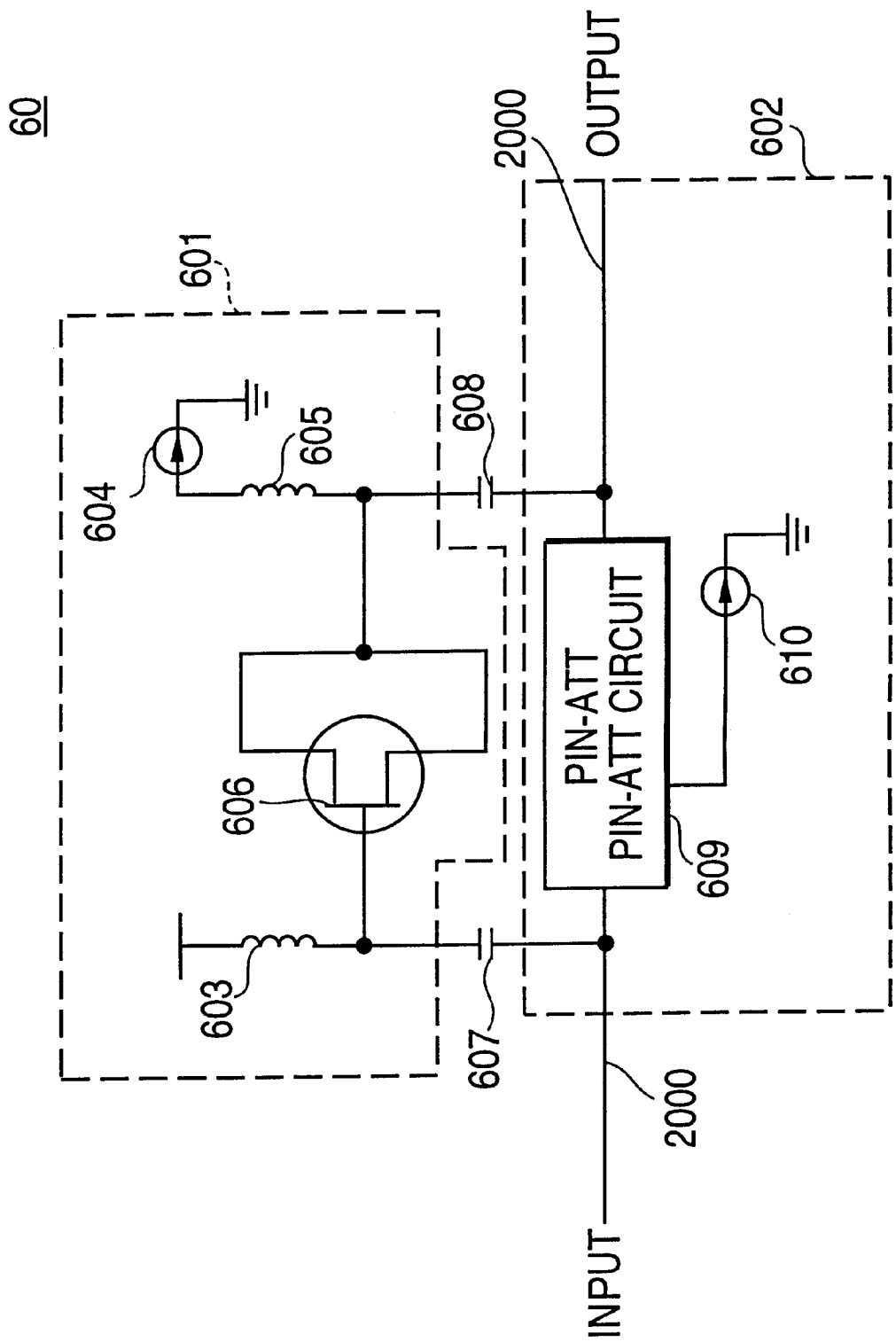
FIG. 9 is a diagram illustrating a distortion compensating unit according to an additional embodiment of the present invention.

FIG. 9 is a diagram illustrating a distortion compensating unit 60 according to an additional embodiment of the present invention, and using a PIN attenuator circuit to adjust the attenuation of an attenuating unit.

Referring now to FIG. 9, an attenuating unit 602 receives an input signal from transmission line 2000, and attenuates the input signal. A distortion generating unit 601 distorts an alternating current component of the input signal. Inductors 603 and 605 prevent high frequency components from being externally transmitted from distortion generating unit 601. An electric current source 604 provides a bias current for a field-effect transistor 606. Capacitors 607 and 608 connect distortion generating unit 601 to attenuating unit 602.

Attenuating unit 602 include a PIN attenuator circuit 609 and an electric current source 610 which provides a bias current to a PIN diode (not illustrated) of PIN attenuator circuit 609. Thus, distortion compensating unit 60 is similar to distortion compensating unit 55 illustrated in FIG. 5, except that attenuating unit 202 of FIG. 5 is replaced with attenuating unit 602 in FIG. 9 having PIN attenuator circuit 609 and electric current source 610.

In FIG. 9, the bias point on a PIN diode of PIN attenuator circuit 609 is moved by adjusting the bias current provided by electric current source 610, thereby changing the resistance of the PIN diode to change the attenuation.

Since the signal electric power provided for distortion generating unit 601 changes with the attenuation by attenuating unit 602, the distortion added by distortion generating unit 601 can be finely adjusted. At this time, the impedance of attenuating unit 602 matches the impedance of transmission line 2000 so that distortion can be compensated over a broad band of several kHz through 1 GHz or more.

Distortion compensating unit 60 allows the power of a signal provided to distortion generating unit 601 to be changed via attenuating unit 602. More specifically, attenuating unit 602 can change the attenuation with a fixed impedance, thereby externally controlling the distortion with precision for a high frequency component of an input signal.

Figure 10:
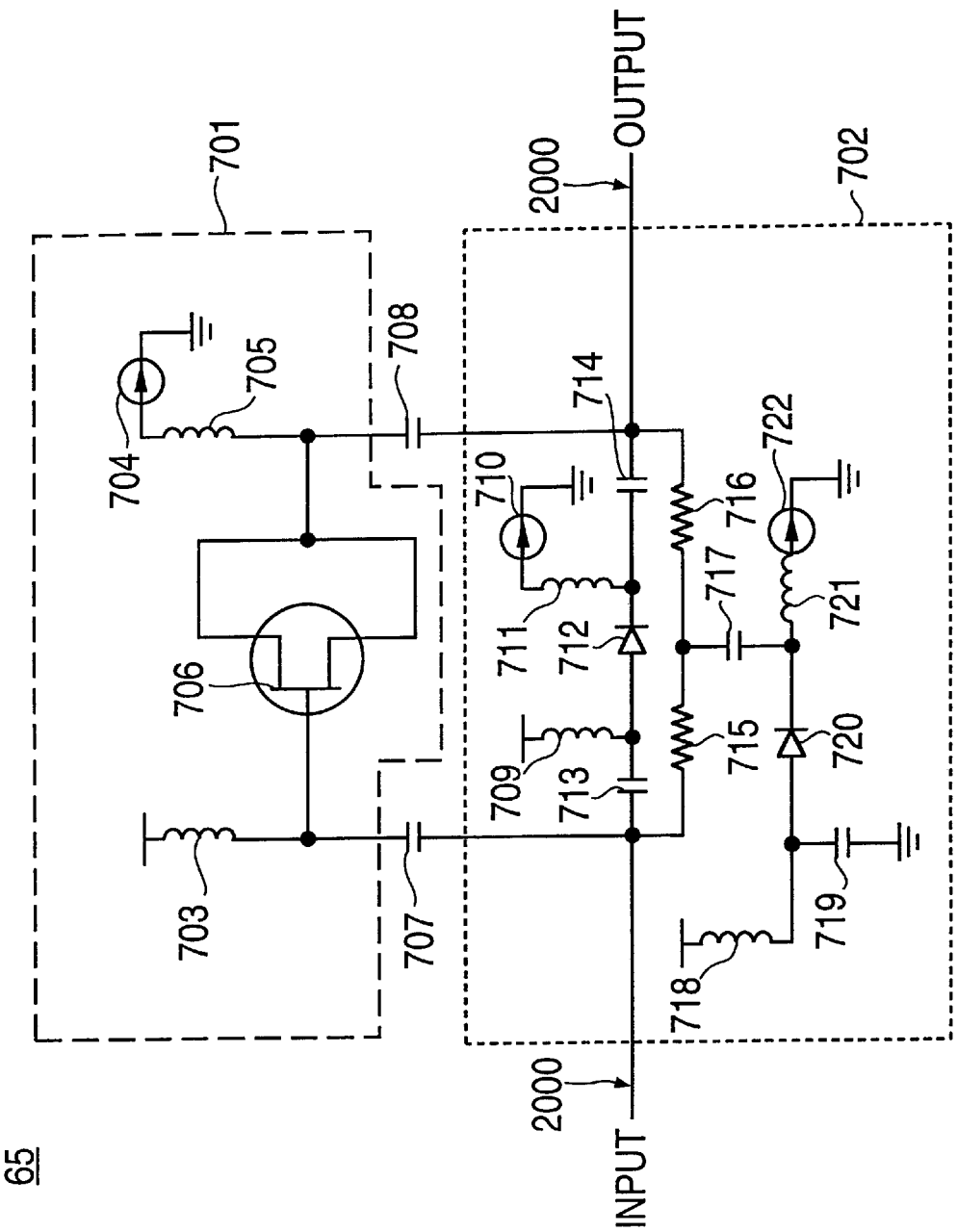
FIG. 10 is a diagram illustrating a distortion compensating unit, according to a further embodiment of the present invention.

FIG. 10 is a diagram illustrating a distortion compensating unit 65 according to an additional embodiment of the present invention. Referring now to FIG. 10, an attenuating unit 702 attenuates an input signal received from transmission line 2000. A distortion generating unit 701 is for distorting the input signal. Inductors 703, 705, 709, 711, 718, and 721 oppose high frequency components. An electric current source 704 provides a bias current for a field-effect transistor 706. An electric current source 710 provides a bias current for a PIN diode 712. An electric current source 722 provides a bias current for a PIN diode 720. A GaAs field-effect transistor 706 generates distortion. Capacitors 707 and 708 couple distortion generating unit 701 to attenuating unit 702. Resistors 715 and 716 maintain an impedance which is consistent with the impedance of transmission line 2000. Capacitors 713 and 714 couple PIN diode 712 to transmission line 2000 using an alternating current. Capacitors 717 and 719 couple PIN diode 720 to transmission line 2000 using an alternating current. PIN diodes 712 and 720 adjust the amount of attenuation provided by attenuating unit 702.

Transmission line 2000 is connected to attenuating unit 702 through the serially-connected resistors 715 and 716. Transmission line 2000 is connected at the input of the distortion compensating unit to the anode terminal of PIN diode 712 through capacitor 713. Transmission line 2000 is connected at the output of distortion compensating unit to the cathode terminal of PIN diode 712 through capacitor 714. The anode of PIN diode 712 is connected to the source through inductor 709, while the cathode of PIN diode 712 is connected to ground through electric current source 710 and inductor 711. The anode of PIN diode 720 is connected to ground through capacitor 719 and is connected to electric current source 722 through inductor 718. The cathode of PIN diode 720 is connected to the connection points of resistors 715 and 716 through capacitor 717, and is connected to ground through the inductor 721 and electric current source 722.

Direct current from electric current source 710 is provided for PIN diode 712 through inductors 709 and 711, to set the bias point of PIN diode 712. Direct current from electric current source 722 is provided for PIN diode 720 through inductors 718 and 721, to set the bias point of PIN diode 720. Adjusting the electric current from electric current sources 710 and 722 moves the bias points of PIN diodes 712 and 720, thereby changing the resistance of PIN diodes 712 and 720 to change the attenuation.

As a distortion generating element, the field-effect transistors 606 and 706 can be GaAs field-effect transistors, or can be replaced with a diode.

Distortion compensating unit 65 allows the power of a signal flowing to distortion generating unit 701 to be adjusted with attenuating unit 702. Attenuating unit 702 can change the attenuation with a fixed impedance, thereby externally controlling the distortion with precision for a high frequency component of an input signal.

Figure 11D:
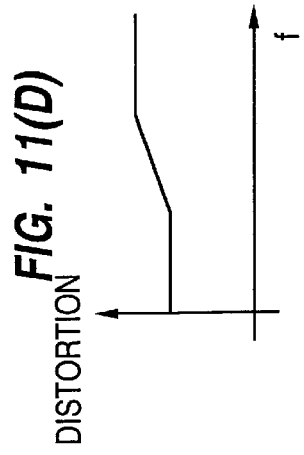
FIGS. 11(B), 11(C), 11(D) and 11(E) are graphs illustrating characteristics of the distortion compensating unit illustrated in FIG. 11(A), according to an embodiment of the present invention.
Figure 11A:
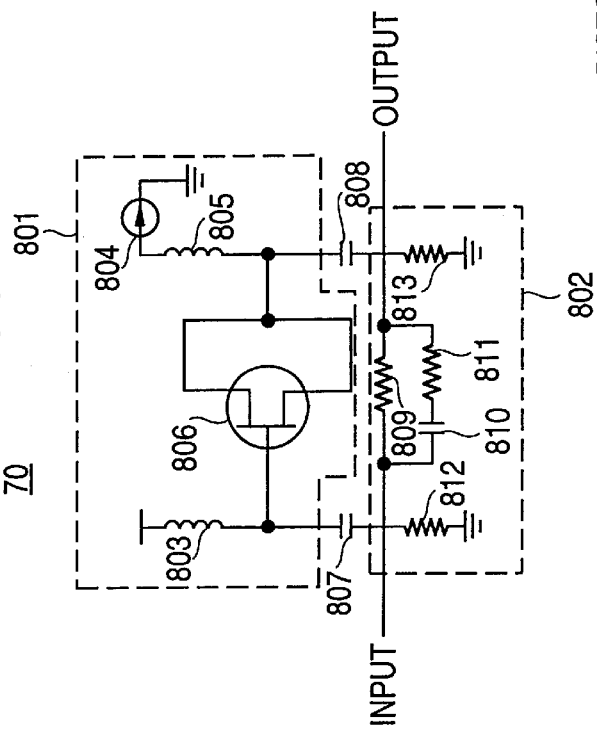
FIG. 11(A) is a diagram illustrating a distortion compensating unit according to an embodiment of the present invention.

FIG. 11(A) is a diagram illustrating a distortion compensating unit 70 according to a further embodiment of the present invention. Distortion compensating unit 70 balances the frequency characteristics of a distortion generating element with the frequency characteristics of a attenuating unit, to provide distortion compensation.

Referring now to FIG. 11(A), a distortion generating unit 801 is for distorting an input signal. An attenuating unit 802 attenuates an input signal received from transmission line 2000. Inductors 803 and 805 oppose high frequency components. An electric current source 804 provides a bias current for a field-effect transistor 806 which generates distortion. Field-effect transistor is preferably a GaAs field-effect transistor. Capacitors 807 and 808 couple distortion generating unit 801 to attenuating unit 802. Resistors 809, 810, 811, 812 and 813 and a capacitor 810 are for attenuating the input signal.

Distortion compensating unit 70 is similar to distortion compensating unit 55 illustrated in FIG. 5, except that attenuating unit 202 of FIG. 5 is replaced with attenuating unit 802 in FIG. 11(A) having frequency characteristics of electric power opposed to those of field-effect transistor 806.

In attenuating unit 802, transmission line 2000 is connected to the input and output of distortion compensating unit 70 through resistor 809. Serially-connected capacitor 810 and resistor 811 are in parallel with resistor 809. At the input of distortion compensating unit 70, transmission line 2000 is connected to ground through resistor 812. At the output of distortion compensating unit 70, transmission line 2000 is connected to ground through resistor 813.

Figure 11B:
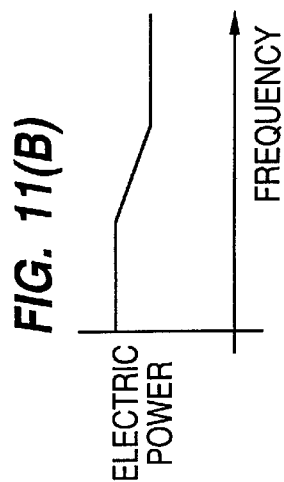
Figure 11E:
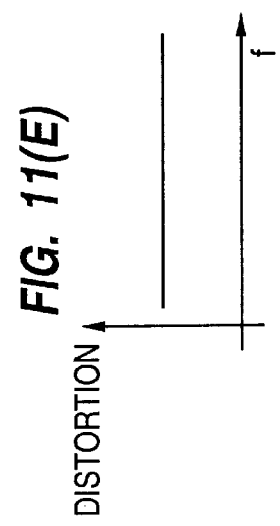
Figure 11C:
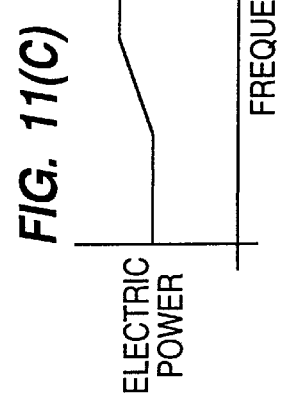

FIG. 11(B) is a graph illustrating the frequency characteristics of the electric power provided to field-effect transistor 806. FIG. 11(C) is a graph illustrating the frequency characteristics of the electric power provided to attenuating unit 802. FIG. 11(D) is a graph illustrating the frequency characteristics of the distortion produced by field-effect transistor 806. FIG. 11(E) is a graph illustrating the distortion of an output signal of distortion compensating unit 70.

When the frequency characteristics of the distortion produced by field-effect transistor 806 indicate an increase in the high frequency range as illustrated in FIG. 11(D), the high frequency range of the electric power provided for attenuating unit 802 is increased as illustrated in FIG. 11(C). As a result, the frequency characteristics of the electric power provided for field-effect transistor 806 decreases in the high frequency range as illustrated in FIG. 11(B)

When an input signal is applied to attenuating unit 802, the attenuation for the component at the high frequency range is smaller than the attenuation for the component at the low frequency range, and the electric power to be provided for distortion generating unit 801 for the component at the high frequency range decreases more than the electric power for the component at the low frequency range. As a result, the decrease of the electric power for the component at the high frequency range to be provided for distortion generating unit 801 offsets the increase of the distortion at the high frequency range in field-effect transistor 806, thereby obtaining an output signal indicating an even, uniform frequency characteristics for the distortion, as illustrated in FIG. 11(D).

Field-effect transistor 806 is preferably a GaAs field-effect transistor, but can be replaced with a diode. A PIN attenuator circuit having frequency characteristics opposed to those of field-effect transistor 806 can replace attenuating unit 802.

Therefore, according to the above embodiments of the present invention, an attenuating unit has frequency characteristic opposed to that of a distortion generating unit. Thus, the frequency characteristics of the distortion generated by the distortion generating unit can be canceled by the frequency characteristic of the power provided for the distortion generating unit, thereby successfully improving the frequency characteristic of the distortion.

Therefore, according to the embodiments of the present invention as illustrated in FIGS. 11(A), 11(B), 11(C), 11(D) and 11(E), an attenuating unit adjusts the power level of power provided to a distortion generating unit by adjusting the signal level of a first signal (that is, an alternating current component separated from the input signal) and a second signal (that is, the input signal after the alternating current component is separated therefrom). An increase in the signal level of the second signal causes a decrease in the signal level of the first signal, and a decrease in the signal level of the second signal causes an increase in the signal level of the first signal. The attenuating unit adjusts the power level of power provided to the distortion generating unit so that the provided power has frequency characteristics which oppose frequency characteristics of the distortion provided by the distortion generating unit.

More specifically, the distortion provided by the distortion generating unit increases as the frequency of the first signal increases, and the attenuating unit adjusts the power level provided to the distortion generating unit so that the provided power decreases when the distortion provided by the distortion generating unit increases. The decrease in power causes the distortion generating unit to decrease the amount of provided distortion.

As described above, attenuating unit 802 has frequency characteristics so that the electric power flowing to a distortion generating element can control the frequency characteristics of distortion, thereby compensating for distortion in a broad band.

According to the above embodiments of the present invention, a GaAs field-effect transistor having a short between the source and drain, or a diode, can be used as a distortion generating element. Furthermore, a resistor network or a PIN attenuating circuit can be used as an attenuating unit. The attenuating unit can be designed to have frequency characteristics opposed to those of the distortion generating unit.

According to the above embodiments of the present invention, distortion generated by a distortion generating unit can be correctly adjusted after adjusting a direct current signal (such as a bias current) of the distortion generating unit. An attenuating unit attenuates an input signal received through a transmission line and is coupled to the distortion generating unit via alternating current. Distortion generated by the distortion generating unit can be adjusted by varying the attenuation by the attenuating unit.

Figure 12:
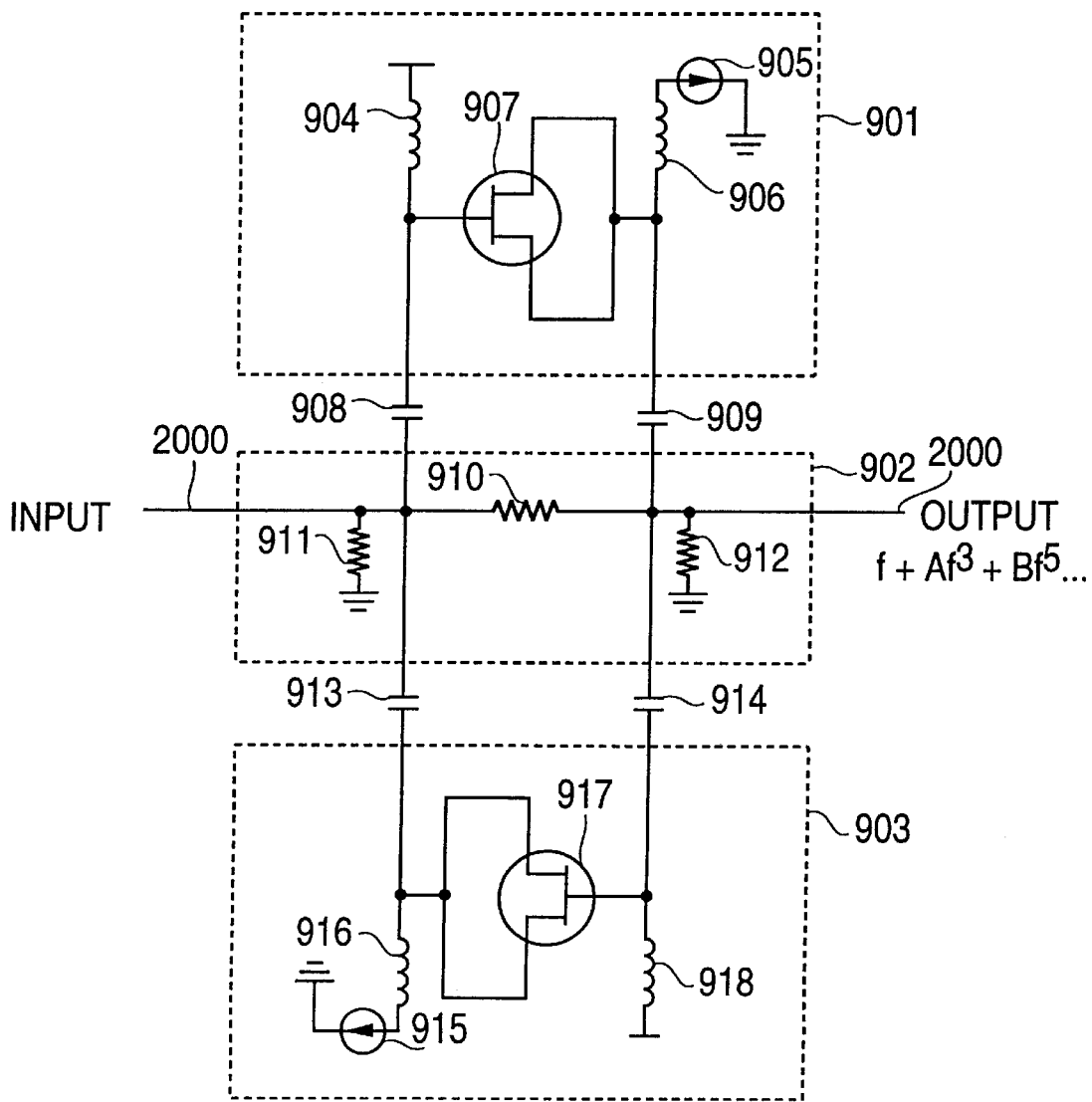
FIG. 12 is a diagram illustrating a distortion compensating unit according to an additional embodiment of the present invention.

FIG. 12 is a diagram illustrating a distortion compensating unit 75 according to an additional embodiment of the present invention. More specifically, FIG. 12 illustrates a distortion compensating unit 75 which cancels even-ordinal distortion to thereby generate only odd-ordinal distortion.

Referring now to FIG. 12, an attenuating unit 902 attenuates an input signal received from transmission line 2000. A distortion generating unit 901 generates distortion for the input signal. A distortion generating unit 903 cancels even-ordinal distortion in the distortion generated by distortion generating unit 901. Inductors 904, 906, 916, and 918 oppose high frequency alternating current. An electric current source 905 provides a bias current for a field-effect transistor 907. An electric current source 915 provides a bias current for a field-effect transistor 917. Field-effect transistors 907 and 917 are preferably GaAs field-effect transistors, and are nonlinear elements for generating distortion. Capacitors 908 and 909 couple distortion generating unit 901 to attenuating unit 902 via alternating current. Capacitors 913 and 914 couple distortion generating unit 903 to attenuating unit 902 via alternating current. Resistors 910, 911 and 912 maintain an impedance which is consistent with the impedance of transmission line 2000.

Distortion compensating unit 75 differs from distortion compensating unit 55 illustrated in FIG. 5 in that FIG. 12 illustrates distortion generating unit 903 connected to attenuating unit 902 through capacitors 913 and 914.

Distortion generating unit 903 is configured the same as distortion generating unit 901, but distortion generating unit 903 is connected to attenuating unit 902 in an inverted arrangement with respect to distortion generating unit 901. That is, the input of distortion compensating unit 75 is connected to the gate of field-effect transistor 907 through capacitor 908, and to the source and drain of field-effect transistor 917 through capacitor 913. Likewise, the output of distortion compensating unit 75 is connected to the source and drain of field-effect transistor 907 through capacitor 909, and to the gate of field-effect transistor 917 through capacitor 914.

Distortion is generated in field-effect transistors 907 an 917 by providing an input signal f to attenuating unit 902. Since field-effect transistors 907 and 917 are connected symmetrically with respect to attenuating unit 902, even-ordinal distortion components generated in field-effect transistors 907 and 917 are canceled, and an odd-ordinal distortion signal $(f+Af^3+Bf^5 \ldots)$ is provided at the output of distortion compensating unit 75. Thus, only odd-ordinal distortion components will be applied to an input signal as distortion, and the odd-ordinal distortion can be adjusted independent of even-ordinal distortion.

Field-effect transistors 907 and 917 can be replaced with a diode, for generating distortion. Moreover, attenuating unit 902 can be replaced with a PIN attenuator circuit, or attenuating unit 902 can have the frequency characteristics opposed to those of field-effect transistor 907 and 917.

Therefore, according to the above embodiments of the present invention, even-ordinal distortions generated by first and second distortion generating units can be canceled by symmetrically arranging the first and second distortion generating units with respect to an attenuating unit, thereby generating only odd-ordinal distortions.

The above embodiments of the present invention allow distortion to be compensated for, without requiring the use of expensive, relatively large directional couplers. Therefore, the overall circuit configuration will be relatively inexpensive and relatively compact.

Figure 13:
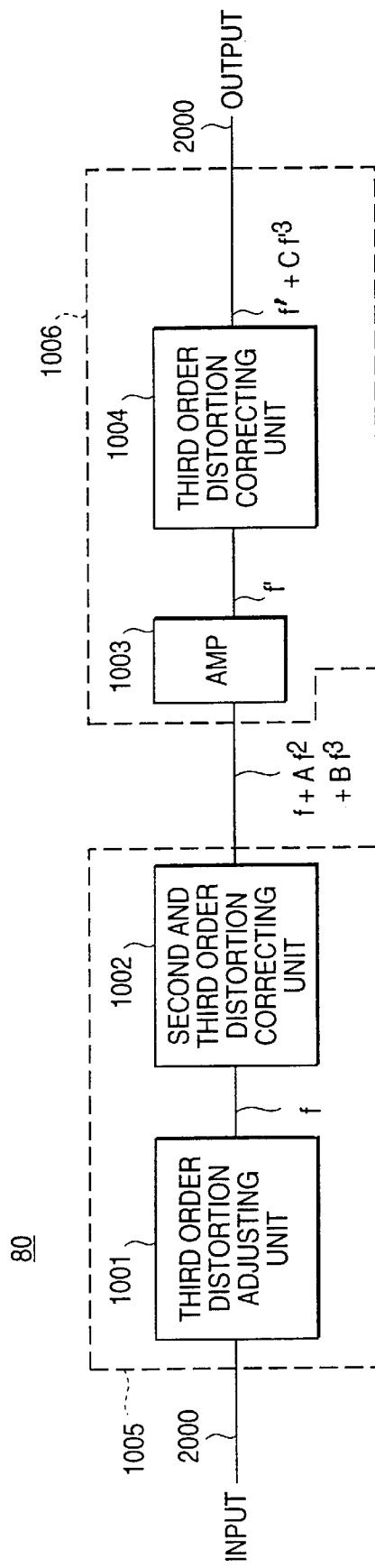
FIG. 13 is a diagram illustrating a distortion compensating unit according to a further embodiment of the present invention.

FIG. 13 is a diagram illustrating a distortion compensating unit 80 according to a still further embodiment of the present invention, for independently controlling second and third order distortion.

Referring now to FIG. 13, distortion compensating unit 80 includes a second order distortion generating unit 1005 and a third order distortion generating unit 1006. Second order distortion generating unit 1005 includes a third order distortion adjusting unit 1001 and a second and third order distortion correcting unit 1002. Third distortion adjusting unit 1001 is an attenuator for lowering the signal level of an input signal. Second and third order distortion correcting unit 1002 distorts the input signal.

Second and third order distortion correcting unit 1002 is, for example, distortion compensating unit 55 illustrated in FIG. 5, and third order distortion correcting unit 1004 is, for example, distortion compensating unit 75 illustrated in FIG. 12. Third order distortion adjusting unit can be a conventional attenuator.

Second distortion generating unit 1005 provides an input signal with only second order distortion. More specifically, third order distortion adjusting unit 1001 lowers the signal level of an input signal so that the distortion B of the third order distortion in the second and third order distortion correcting unit 1002 is equal to or less than a predetermined value. At this time, the distortion B of the third order distortion in second and third order distortion correcting unit 1002 is more dependent on the signal level of the input signal than the distortion A of the second order distortion. Therefore, by adjusting the signal level of the input signal, the distortion B of the third order distortion can be lowered so that second and third order distortion correcting unit 1002 can produce second order distortion.

Third order distortion generating unit 1006 includes an amplifier 1003 for amplifying the output of second order distortion generating unit 1005, and a third order distortion correcting unit 1004 for generating third order distortion. More specifically, amplifier 1003 amplifies the input level of the signal produced by second order distortion generating unit 1005, up to a level at which third order distortion can be generated. In this manner, third order distortion correcting unit will receive the amplified signal and will be able to generate only third order distortion.

Thus, the second order distortion provided by second order distortion generating unit 1005 and the third order distortion provided by third order distortion generating unit 1006 are generated independently of each other, and the second and third order distortions can be independently adjusted.

More specifically, as illustrated in FIG. 13, if an input signal f' is provided to third order distortion correcting unit 1004, then a third order distortion is provided by third order distortion correcting unit 1004 with the fourth and subsequent order distortions assumed to be zero and ignored. An output signal f'' from third order distortion correcting unit 1004 is represented by the following Equation (1).
Equation(1):

$$f''=f'+Cf'^3$$

If, as illustrated in FIG. 13, an input signal f is provided to second and third order distortion correcting unit 1002, then second and third order distortions are provided by second and third order distortion correcting unit 1002 with the fourth and subsequent order distortions assumed to be zero and ignored. The output signal f' from second and third order distortion correcting unit 1002 is represented by the following Equation (2).

Equation(2):

$$f'=f+A f^2+B f^3$$

If Equation (2) is substituted for Equation (1) with the fourth and subsequent terms assumed to be zero and ignored, then $$f''=f'+Cf'^3=(f+Af^2+Bf^3)+C(f+Af^2+Bf^3)^3=(f+Af^2+Bf^3)+Cf^3=f+Af^2+(B+C)f^3$$

The last equation ($f''=f+Af^2+(B+C) f^3$) is hereinafter referred to as Equation (3).

Third order distortion adjusting unit 1001 attenuates the signal level of the input signal f down to a level at which second and third order distortion correcting unit 1002 can essentially ignore the third distortion B as compared with the second distortion A. Thus, as compared with the coefficient C, the coefficient B can be ignored in Equation (3).

As a result, Equation (3) can be approximated into the following Equation (4).

Equation (4):

$$f''=f+Af^2+Cf^3$$

where (B<<C), and the coefficient A of the second order distortion can be independently adjusted by second order distortion generating unit 1005, and the coefficient C of the third order distortion can be independently adjusted by third order distortion generating unit 1006. Therefore, the second and third order distortions can be independently adjusted.

Therefore, second order distortion generating unit 1005 provides second order distortion for an input signal. Third order distortion adjusting unit 1001 attenuates, or lowers, the signal level of the input signal so that second order distortion generating unit 1005 is prevented from generating third and subsequent order distortions. Third order distortion generating unit 1005 is connected in cascade with second order distortion generating unit 1005, and provides third order distortion for the input signal by canceling even-ordinal distortions.

More specifically, when second order distortion is generated, the generation of the third order distortion is suppressed by lowering the signal level of the input signal. When third order distortion is generated, the second order distortion generated by a distortion generating element is canceled by positioning a distortion generating element symmetrically with respect to an attenuating unit (as illustrated, for example, in FIG. 12).

Figure 14:
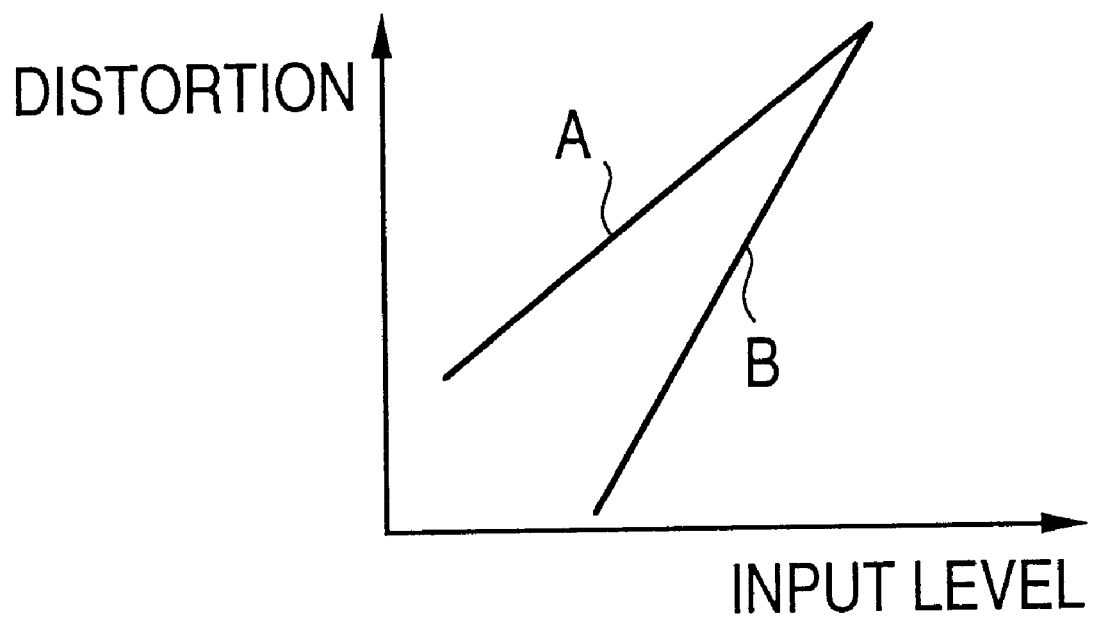
FIG. 14 is a graph illustrating a change in distortion of second and third order distortion depending on the input level of an input signal, of the distortion compensating unit illustrated in FIG. 13, according to an embodiment of the present invention.

FIG. 14 is a graph illustrating a change in distortion of second and third order distortions depending on the signal level of an input signal, of distortion compensating unit 80 illustrated in FIG. 13, according to an embodiment of the present invention.

As described above, second order distortion generating unit 1005 is connected in cascade with third order distortion generating unit 1006 to independently adjust the second and third order distortion. As a result, a directional coupler is not required, and a relatively compact and inexpensive circuit configuration can be realized. Moreover, since third order distortion adjusting unit 1001 attenuates the signal level of an input signal before second order distortion is generated and while third order distortion is being suppressed, second order distortion generating unit 1005 can be designed without requiring the use of 180 degree coupler.

According to the above embodiments of the present invention, distortion can be compensated over a broad band from several KHz to 1 GHz or more. Therefore, a distortion compensating unit can be provided and which is applicable to a multiple-channel system such as a 100–150 channel video on demand system.

According to the above embodiments of the present invention, a capacitor is used as coupling unit for coupling a transmission line to a distortion generating unit. Therefore, the scale of the overall circuit can be smaller than a circuit which requires a directional coupler. As a result, the space of the coupling unit can be reduced to 1/20 or 1/30 of the size of a coupling unit requiring a directional coupler.

Although a few preferred embodiments of the present invention have been shown and described, it would be appreciated by those skilled in the art that changes may be made in the embodiments without departing from the principles and spirit of the invention, the scope of which is defined in the claims and their equivalents.

What is claimed is:

1. An apparatus for providing distortion to an input signal, comprising:
   a first coupler which separates a first alternating current component from the input signal, to provide a first signal representing the first alternating current component and a second signal representing the input signal having the first alternating current component separated therefrom;
   an adjusting unit which adjusts the signal level of the first and second signals;
   a first distortion generating unit which provides nonlinear distortion to the signal level adjusted first signal, to produce a distorted first signal; and
   a second coupler which combines the signal level adjusted second signal with the distorted first signal, to produce a corresponding output signal.

2. An apparatus as in claim 1, further comprising:
   a transmission line which provides the input signal to the adjusting unit and the first coupler, the adjusting unit having an impedance which matches the impedance of the transmission line.

3. An apparatus as in claim 2, wherein the adjusting unit comprises a PIN attenuator for adjusting the signal level of the first and second signals.

4. An apparatus as in claim 1, wherein the adjusting unit comprises a PIN attenuator for adjusting the signal level of the first and second signals.

5. An apparatus as in claim 1, wherein
   the adjusting unit adjusts a power level of power provided to the first distortion generating unit by adjusting the signal level of the first and second signals, an increase in the signal level of the second signal causing a decrease in the signal level of the first signal, and a decrease in the signal level of the second signal causing an increase in the signal level of the first signal, and
   the adjusting unit adjusts said power level of power provided to the first distortion generating unit so that the provided power has frequency characteristics which oppose frequency characteristics of the distortion provided by the first distortion generating unit.

6. An apparatus as in claim 5, wherein
   the distortion provided by the first distortion generating unit increases as the frequency of the first signal increases, and the adjusting unit adjusts the power level provided to the first distortion generating unit so that the provided power decreases when the distortion provided by the first distortion generating unit increases, the decrease in power causing the first distortion generating unit to decrease the amount of provided distortion.

7. An apparatus as in claim 1, wherein the first distortion generating unit comprises:

a nonlinear element which receives a bias current and generates the nonlinear distortion in accordance with the received bias current; and a current generator which generates and controls the bias current.

8. An apparatus as in claim 7, wherein the nonlinear element is a field-effect transistor having a drain and source connected together.

9. An apparatus as in claim 5, wherein the first distortion generating unit comprises:

a nonlinear element which receives a bias current and generates the nonlinear distortion in accordance with the received bias current; and a current generator which generates and controls the bias current.

10. An apparatus as in claim 9, wherein the nonlinear element is a field-effect transistor having a drain and source connected together.

11. An apparatus as in claim 7, wherein the nonlinear element is a diode.

12. An apparatus as in claim 9, wherein the nonlinear element is a diode.

13. An apparatus as in claim 7, wherein the nonlinear element has an input terminal and an output terminal, and the first distortion generating unit further comprises:

a first inductor connected to the input terminal of the nonlinear element; and a second inductor connected to the output terminal of the nonlinear element.

14. An apparatus as in claim 1, wherein the first and second couplers each comprise a capacitor.

15. An apparatus as in claim 1, wherein the first and second couplers are capacitors connecting the adjusting unit to the first distortion generating unit.

16. An apparatus as in claim 1, further comprising:

an attenuator which adjusts the signal level of the input signal before the first alternating current component is separated from the input signal by the first coupler.

17. An apparatus as in claim 1, further comprising:

a third coupler which separates a second alternating current component from the input signal, to provide a third signal representing the second alternating current component, the second signal representing the input signal with the first and second alternating current components separated therefrom, and the adjusting unit adjusts the signal level of the first, second and third signals;

a second distortion generating unit which provides nonlinear distortion to the signal level adjusted third signal, to produce a distorted third signal; and a fourth coupler which combines the signal level adjusted second signal with the distorted third signal.

18. An apparatus as in claim 17, wherein the first and second distortion generating units together operate to cancel even-ordinal distortion and thereby produce only odd-ordinal nonlinear distortion.

19. An apparatus as in claim 17, further comprising:

an attenuator which adjusts the signal level of the input signal before the first and second alternating current component are separated from the input signal.

20. An apparatus as in claim 19, wherein the first and second distortion generating units together operate to cancel even-ordinal distortion and thereby produce only odd-ordinal nonlinear distortion.

21. An apparatus as in claim 1, wherein the first and second couplers, the adjusting unit and the first distortion generating unit together form a second and third order distortion unit which provides second and third order distortion to the input signal, to produce a second and third order distorted output signal, the apparatus further comprising:

an attenuator which adjusts the signal level of the input signal before the first alternating current component is separated from the input signal, to allow the second and third order distortion unit to produce a second and third order distorted output signal having a suppressed third order component; and a third order distortion generating unit which provides third order distortion to the second and third order distorted output signal.

22. An apparatus as in claim 21, wherein the third order distortion generating unit comprises:

an amplifier which amplifies the second and third order distorted output signal;

couplers which separate a first alternating current component and a second alternating current component from the amplified second and third order distorted output signal, to provide a first signal representing the first alternating current component, a second signal representing the second alternating current component, and a third signal representing the second and third order distorted output signal having the first and second alternating current components separated therefrom;

an adjusting unit which adjusts the signal level of the first, second, and third signals;

a first distortion generating unit which provides nonlinear distortion to the signal level adjusted first signal, to produce a distorted first signal;

a second distortion generating unit which provides nonlinear distortion to the signal level adjusted second signal, to produce a distorted second signal; and couplers which combines the signal level adjusted third signal with the distorted first and second signals, to produce a corresponding output signal.

23. An apparatus for providing distortion to an input signal, comprising:

a first attenuator which attenuates the signal level of the input signal;

a first coupler which separates an alternating current component from the attenuated input signal, to provide a first signal representing the alternating current component and a second signal representing the input signal having the alternating current component separated therefrom;

a second attenuator which attenuates the signal level of the first and second signals;

a distortion generating unit which provides nonlinear distortion to the signal level attenuated first signal, to produce a distorted first signal; and a second coupler which combines the signal level attenuated second signal with the distorted first signal.

24. A method for providing distortion to an input signal, comprising the steps of:

separating a first alternating current component from the input signal, to provide a first signal representing the first alternating current component and a second signal representing the input signal having the first alternating current component separated therefrom;

adjusting the signal level of the first and second signals;

providing nonlinear distortion to the signal level adjusted first signal, to produce a distorted first signal; and combining the signal level adjusted second signal with the distorted first signal, to produce a corresponding output signal.

25. A method as in claim 24, further comprising the steps of:

separating a second alternating current component from the input signal, to provide a third signal representing the second alternating current component, the second signal representing the input signal with the first and second alternating current components separated therefrom;

adjusting the signal level of the third signal;

providing nonlinear distortion to the signal level adjusted third signal, to produce a distorted third signal; and combining the signal level adjusted second signal with the distorted third signal.

26. A method as in claim 25, wherein the steps of providing nonlinear distortion to the signal level adjusted first signal and providing nonlinear distortion to the signal level adjusted third signal, together operate to cancel even-ordinal distortion and thereby produce only odd-ordinal nonlinear distortion.

27. A method for providing distortion to an input signal, comprising the steps of:

generating second order distortion and providing the generated second order distortion to the input signal while suppressing third order distortion, to produce a second order distorted output signal; and generating distortion and cancelling even-ordinal components of the generated distortion to generate third order distortion, and providing the third order distortion to the second order distorted output signal, to produce an output signal having second and third order distortion.

28. A method claim 27, wherein the step of generating second order distortion comprises the steps of:

attenuating the signal level of the input signal;

separating an alternating current component from the attenuated input signal, to provide a first signal representing the alternating current component and a second signal representing the input signal having the alternating current component separated therefrom;

adjusting the signal level of the first and second signals;

providing nonlinear distortion to the signal level adjusted first signal, to produce a distorted first signal; and combining the signal level adjusted second signal with the distorted first signal, to produce the second order distorted output signal.

29. A method as in claim 28, wherein the step of generating distortion and cancelling even-ordinal components of the generated distortion to generate third order distortion comprises the steps of:

amplifying the second order distorted output signal;

separating a first alternating current component and a second alternating current component from the amplified second order distorted output signal, to provide a first signal representing the first alternating current component, a second signal representing the second alternating current component, and a third signal representing the second order distorted output signal having the first and second alternating current components separated therefrom;

adjusting the signal level of the first, second, and third signals;

providing nonlinear distortion to the signal level adjusted first signal, to produce a distorted first signal;

providing nonlinear distortion to the signal level adjusted second signal, to produce a distorted second signal; and combining the signal level adjusted third signal with the distorted first and second signals, to produce a corresponding output signal.

* * * * *